(12) United States Patent
Yu et al.

(10) Patent No.: US 12,720,701 B2
(45) Date of Patent: Aug. 25, 2026

(54) VEHICLE CONTROLLER AND VEHICLE WITH SAME

(71) Applicant: BYD COMPANY LIMITED, Shenzhen (CN)

(72) Inventors: Fengchuan Yu, Shenzhen (CN); Xingchun Zhang, Shenzhen (CN); Yanjun Fan, Shenzhen (CN); Qinghui Zeng, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 417 days.

(21) Appl. No.: 18/372,218

(22) Filed: Sep. 25, 2023

(65) Prior Publication Data

US 2024/0015915 A1 Jan. 11, 2024

Related U.S. Application Data

(63) Continuation of application No. PCT/CN2022/084265, filed on Mar. 31, 2022.

(30) Foreign Application Priority Data

Jun. 18, 2021 (CN) ......................... 202110681270.3

(51) Int. Cl.
*H05K 7/14* (2006.01)
*B60R 16/023* (2006.01)
(Continued)

(52) U.S. Cl.
CPC ....... *H05K 7/1427* (2013.01); *B60R 16/0239* (2013.01); *B60R 16/033* (2013.01);
(Continued)

(58) Field of Classification Search
USPC .......................................................... 361/752
See application file for complete search history.

(56) References Cited

U.S. PATENT DOCUMENTS

2019/0115848 A1* 4/2019 Okazaki .................. H02M 7/48

FOREIGN PATENT DOCUMENTS

CN 101734169 A 6/2010
CN 102826054 A 12/2012
(Continued)

OTHER PUBLICATIONS

International Search Report and Written Opinion for Application No. PCT/CN2022/084265, mailed on Jun. 23, 2022, 8 pages.
(Continued)

*Primary Examiner* — Hung S. Bui
(74) *Attorney, Agent, or Firm* — Sheppard Mullin Richter & Hampton LLP

(57) ABSTRACT

A vehicle controller includes: a box; a control board mounted in the box and including a communication module, a vehicle control module, a charge control module, and a motor control module, and the vehicle control module controlling operations of a vehicle according to signals of the communication module; a driver board mounted in the box, the control board being connected to the driver board, and the motor control module controlling a motor of the vehicle through the driver board; and an on-off switch mounted in the box and connected to the control board, the on-off switch having an input end and an output end, the charge control module controlling on-off of the input end and the output end, the output end being connected to an energy storage member of the vehicle, and the input end being connected to a charging cable of the energy storage member.

19 Claims, 8 Drawing Sheets

(51) Int. Cl.

| | |
|---|---|
| ***B60R 16/033*** | (2006.01) |
| ***H02M 7/00*** | (2006.01) |
| ***H02M 7/537*** | (2006.01) |
| ***H05K 1/181*** | (2026.01) |
| ***H05K 5/03*** | (2006.01) |
| ***H05K 9/00*** | (2006.01) |

(52) U.S. Cl.

CPC .......... *H02M 7/003* (2013.01); *H02M 7/537* (2013.01); *H05K 1/181* (2013.01); *H05K 5/03* (2013.01); *H05K 9/0007* (2013.01); *H05K 2201/10151* (2013.01)

(56) References Cited

FOREIGN PATENT DOCUMENTS

| | | | | | |
|---|---|---|---|---|---|
| CN | 203727196 | U | | 7/2014 | |
| CN | 105846750 | A | | 8/2016 | |
| CN | 110091814 | A | | 8/2019 | |
| CN | 210579859 | A | | 5/2020 | |
| CN | 111385985 | A | | 7/2020 | |
| CN | 212231286 | U | | 12/2020 | |
| CN | 112303530 | A | | 2/2021 | |
| CN | 112693555 | A | | 4/2021 | |
| CN | 213199467 | U | | 5/2021 | |
| CN | 213342870 | U | * | 6/2021 | ............... H05K 5/02 |
| JP | 3086609 | U | | 6/2002 | |
| KR | 20210051227 | A | | 5/2021 | |
| WO | 2017188268 | A1 | | 11/2017 | |
| WO | WO-2018054292 | A1 | * | 3/2018 | .......... F04C 18/0215 |

OTHER PUBLICATIONS

Examination Report No. 1 dated Oct. 1, 2024, issued in related Australian Patent Application No. 2022292520 (4 pages).

First Office Action and Search Report dated Jan. 7, 2025, issued in related Chinese Patent Application No. 202110681270.3, with English machine translation (10 pages).

Request for the Submission of an Opinion dated Apr. 9, 2025, issued in related Korean Patent Application No. 10-2023-7033295, with English machine translation (8 pages).

Notice of Reasons for Refusal dated Dec. 3, 2024, issued in related Japanese Patent Application No. 2023-558972, with English machine translation (8 pages).

Notice of Reasons for Refusal dated Jul. 1, 2025, issued in related Japanese Patent Application No. 2023-558972, with English machine translation (8 pages).

Extended European Search Report dated Jul. 25, 2024, issued in related European Patent Application No. 22823852.3 (16 pages).

* cited by examiner

VEHICLE CONTROLLER AND VEHICLE WITH SAME

CROSS-REFERENCE TO RELATED APPLICATIONS

This application is a Continuation Application of International Patent Application No. PCT/CN2022/084265, filed on Mar. 31, 2022, which is based on and claims priority to and benefits of Chinese Patent Application No. 202110681270.3, filed on Jun. 18, 2021. The entire content of all of the above-referenced application is incorporated herein by reference.

FIELD

The present disclosure relates to the technical field of vehicles, and more particularly, to a vehicle controller and a vehicle with the same.

BACKGROUND

A vehicle controller in the related art usually includes a box, a control board, a driver board, a vehicle control unit, and a charge controller for achieving a vehicle control function, a motor control function, and a charge control function. The above multiple control assemblies are respectively mounted in different box bodies. Each box is configured independently. Therefore, the vehicle controller has a large number of parts. Moreover, conductive members such as conductors or plug connectors need to be configured for electric connection among the multiple control assemblies. These conductive members are often at least partially exposed to outside of the box bodies, resulting in inconvenient connection, poor electric connection reliability, and poor shielding effect of the box bodies on the above conductive members.

SUMMARY

The present disclosure solves at least one of the technical problems in the related art. The present disclosure provides a vehicle controller and a vehicle with the same. The vehicle controller integrates a vehicle control function, a charge control function, and a motor control function into a same control board, and has the advantages of a high integration level, few parts, good shielding effect, a reliable electric connection, and the like.

The present disclosure further provides a vehicle with the above vehicle controller.

An embodiment of a first aspect of the present disclosure provides a vehicle controller, which includes a box; a control board, mounted in the box and including a communication module, a vehicle control module, a charge control module, and a motor control module, and the vehicle control module controlling operations of a vehicle according to signals of the communication module; a driver board, mounted in the box, the control board being connected to the driver board, and the motor control module controlling a motor of the vehicle through the driver board; and an on-off switch, mounted in the box and connected to the control board, the on-off switch having an input end and an output end, the charge control module controlling on-off of the input end and the output end, the output end being connected to an energy storage member of the vehicle, and the input end being connected to a charging cable of the energy storage member.

The vehicle controller according to the embodiments of the present disclosure is capable of integrating a vehicle control function, a charge control function, and a motor control function into a same control board, and thus has the advantages of a high integration level, few parts, good shielding effect, a reliable electric connection, and the like.

According to some embodiments of the present disclosure, the communication module includes a signal plug connector. The signal plug connector is exposed from the box and has a plugging area for signal transmission. A signal shielding cover is disposed on the control board. The signal shielding cover covers a portion of the signal plug connector and exposes the plugging area the plugging area.

According to some embodiments of the present disclosure, the input end is connected to a positive charging bar and a negative charging bar. A positive pole of the charging cable is connected to the positive charging bar. A negative pole of the charging cable is connected to the negative charging bar. The charging cable passes through the box. The output end is connected to a positive direct current bar and a negative direct current bar. A direct current plug connector is mounted on the box and is exposed from the box. The positive direct current bar and the negative direct current bar are connected to a first end of the direct current plug connector. A second end of the direct current plug connector is connected to the energy storage member.

According to some embodiments of the present disclosure, a first magnet ring is mounted on the box. The positive direct current bar and the negative direct current bar pass through the first magnet ring. The direct current plug connector is mounted on the box and is connected to the energy storage member. A capacitor, mounted on the box and having a capacitor input end and a capacitor output end, the direct current plug connector being connected to the capacitor input end; and an insulated-gate bipolar transistor (IGBT) module, mounted on the box and having a direct current input end, an alternating current output end, and a signal output end, the direct current input end being connected to the capacitor output end, the signal output end being connected to the driver board, and the alternating current output end being connected to a three-phase input end of a motor of the vehicle.

According to some embodiments of the present disclosure, the vehicle controller further includes: an electromagnetic shielding slab, mounted on the box. The control board is located on a first surface of the electromagnetic shielding slab facing away from the box. The driver board, the capacitor, and the IGBT module are located on a second surface of the electromagnetic shielding slab facing the box.

According to some embodiments of the present disclosure, a three-phase adapter bar and a three-phase conductive member are mounted on the box. The three-phase conductive member is wrapped with an insulating member. A first end of the three-phase adapter bar is connected to the alternating current output end, a second end of the three-phase adapter bar is connected to a second end of the three-phase conductive member, and a first end of the three-phase conductive member is connected to the three-phase input end of the motor. A Hall element is disposed on the driver board. The three-phase adapter bar passes through the Hall element.

According to some embodiments of the present disclosure, the control board is connected to a resolver plug connector. The resolver plug connector passes through the box and is connected to the motor of the vehicle. The resolver plug connector is used for detecting an angular displacement and an angular velocity of the motor.

According to some embodiments of the present disclosure, the vehicle controller further includes: a direct current plug connector, mounted on the box and connected to the energy storage member; a power board, connected to a positive power line, a negative power line, a power signal line, an alternating current adapter end, and a direct current adapter end, the positive power line and the negative power line being connected to the direct current plug connector, and the power signal line being connected to the communication module; an alternating current output plug connector, connected to the alternating current adapter end and mounted on the box, the alternating current output plug connector being exposed from the box; and a direct current output plug connector, mounted on the box and connected to the direct current adapter bar and a direct current filter board, the direct current filter board being connected to the direct current adapter end, and the direct current output plug connector being exposed from the box.

According to some embodiments of the present disclosure, the power board is disposed adjacent to a first surface of the box in a thickness direction of the box. The control board and the driver board are disposed adjacent to a second surface of the box in the thickness direction of the box opposite to the first surface. A first cover plate is mounted on the first surface of the box and sealing the power board in the box; and a second cover plate is located on the second surface of the box and sealing the control board and the driver board in the box.

According to some embodiments of the present disclosure, the positive power line is connected to a first electric protection member. The first electric protection member is connected to the direct current plug connector. A second magnet ring surrounds a peripheral surface of the direct current adapter bar.

According to some embodiments of the present disclosure, an alternating current shielding cavity, a power line shielding cavity, a power signal line shielding cavity, and a direct current output shielding cavity are formed on a side surface of the box facing the power board. A conductor of the alternating current output plug connector is located in the alternating current shielding cavity. The alternating current shielding slab is mounted on the box. The alternating current shielding slab seals the alternating current shielding cavity. The positive power line and the negative power line are located in the power line shielding cavity. The power signal line is located in the power signal line shielding cavity. A power line cover plate and a signal line cover plate are mounted on the box. The power line cover plate seals the power signal line shielding cavity. The signal line cover plate seals the power signal line shielding cavity. The direct current adapter bar and the direct current filter board are located in the direct current output shielding cavity. The direct current shielding slab is mounted on the box. The direct current shielding slab seals the direct current output shielding cavity.

According to some embodiments of the present disclosure, the power board includes: a board body, the positive power line, the negative power line, the power signal line, the alternating current adapter end, and the direct current adapter end being disposed on the board body; an alternating current inductor and a direct current inductor, respectively mounted on two edge portions of the board body along a width direction of the board body, the alternating current inductor, the direct current inductor, and the power signal line being located at a same end of the board body in a length direction of the board body; a transformer inductor, mounted on the board body and located between the alternating current inductor and the direct current inductor in the width direction of the board body; a transformer, mounted on the board body and located at an end of the board body away from the power signal line; and a metal oxide semiconductor (MOS) device, mounted on the board body and located on both end portions of the transformer in the width direction of the board body.

According to some embodiments of the present disclosure, a direct current inductance shielding cavity, an alternating current inductance shielding cavity, a transformer inductance shielding cavity, and MOS device shielding cavity are disposed on a side surface of the box facing the power board. The direct current inductor is located in the direct current inductance shielding cavity. The alternating current inductor is located in the alternating current inductance shielding cavity. The transformer inductor is located in the transformer inductance shielding cavity. The MOS device is located in the MOS device shielding cavity. The board body seals the direct current inductance shielding cavity, the alternating current inductance shielding cavity, the transformer inductance shielding cavity, and the MOS device shielding cavity.

According to some embodiments of the present disclosure, a detachable maintenance board is mounted on the box. A first electrical connector is mounted on the maintenance board. A second electrical connector in contact and conductive with the first electrical connector is mounted on the box. The control board detects on-off of the first electrical connector and the second electrical connector to control on-off of the energy storage member.

According to some embodiments of the present disclosure, the vehicle controller further includes: a direct current plug connector, mounted on the box and connected to the energy storage member; and a power supply plug connector, mounted on the box and exposed from the box, the power supply plug connector being connected to a positive heating wire and a negative heating wire, the positive heating wire and the negative heating wire being connected to the direct current plug connector, and the power supply plug connector being connected to a heating member for heating the energy storage member. A third magnet ring is mounted on the box. The positive heating wire and the negative heating wire pass through the third magnet ring. The positive heating wire is connected to a second electric protection member. The second electric protection member is connected to the direct current plug connector. The power supply plug connector is connected to a compressor of a vehicle air-conditioner.

An embodiment in a second aspect of the present disclosure provides a vehicle, which includes: a vehicle controller according to the embodiment in the first aspect of the present disclosure; a power box, mounted on the box of the vehicle controller; a motor and a transmission, being in transmission connection and located in the power box, the motor being electrically connected to the driver board; and an energy storage member, connected to an output end of the on-off switch.

The vehicle according to the embodiment in the second aspect of the present disclosure has the advantages of a high integration level, few parts, good shielding effect, a reliable electric connection, and the like using the vehicle controller according to the embodiment in the first aspect of the present disclosure.

The additional aspects and advantages of the present disclosure will be provided in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible from the following descriptions of the embodiments with reference to the accompanying drawings, where.

Figure 1:
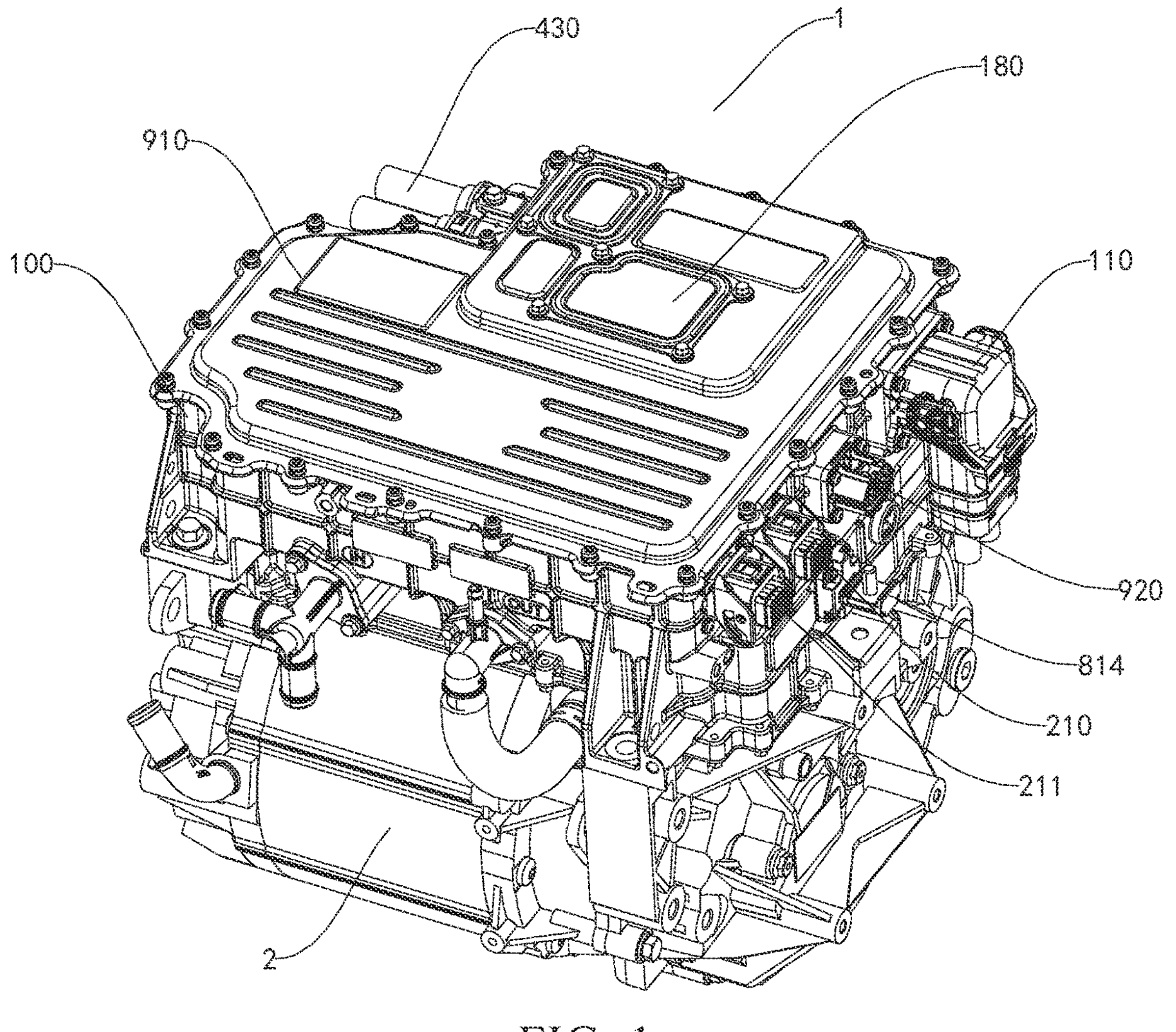
FIG. 1 is a schematic structural diagram of a vehicle controller according to an embodiment of the present disclosure.

REFERENCE NUMERALS IN THE DRAWINGS vehicle controller 1, box 100, direct current plug connector 110, first magnet ring 120, three-phase adapter bar 130, three-phase conductive member 140, insulating member 141, power line shielding cavity 151, power signal line shielding cavity 152, direct current output shielding cavity 153, alternating shielding cavity 154, power line cover plate 155, signal line cover plate 156, direct current inductance shielding cavity 160, alternating current inductance shielding cavity 161, transformer inductance shielding cavity 162, MOS device shielding cavity 163, direct current shielding slab 171, maintenance board 180, first electrical connector 181, second electrical connector 182, third magnet ring 190, control board 200, signal plug connector 210, plugging area 211, signal shielding cover 220, resolver plug connector 230, driver board 300, Hall element 310, on-off member/switch 400, positive charging bar 411, negative charging bar 412, positive direct current bar 421, negative direct current bar 422, charging cable 430, capacitor 500, capacitor input end 510, IGBT module 530, electromagnetic shielding slab 600, power board 700, first electric protection member 710, board 720, alternating current inductor 730, direct current inductor 740, transformer inductor 750, transformer 760, MOS device 770, power signal line 780, alternating current output plug connector 800, direct current adapter bar 811, second magnet ring 812, direct current filter board 813, direct current output plug connector 814, first cover plate 900, second cover plate 910, power supply plug connector 920, second electric protection member 921, and power box 2.

DETAILED DESCRIPTION

The embodiments of the present disclosure are described below in detail. Examples of the embodiments are shown in the accompanying drawings, and same or similar reference signs in all the accompanying drawings indicate same or similar components or components having same or similar functions. The embodiments described below with reference to the accompanying drawings are exemplary, and are merely to explain the present disclosure and cannot be construed as a limitation to the present disclosure.

In the description of the present disclosure, it should be understood that orientation or position relationships indicated by the terms such as "center", "longitudinal", "transverse", "length", "width", "thickness", "upper", "lower", "front", "back", "left", "right", "vertical", "horizontal", "top", "bottom", "inside", "outside", "axial", "radial", and "circumferential" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of the present disclosure.

In the description of the present disclosure, "first feature" and "second feature" may include one or more of the features.

In the description of the present disclosure, "multiple/a plurality of" means two or more than two, and "several" means one or more.

The vehicle controller 1 according to this embodiment of the present disclosure is described below with reference to the accompanying drawings.

As shown in FIG. 1 to FIG. 8, the vehicle controller 1 according to this embodiment of the present disclosure includes a box 100, a control board 200, a driver board 300, and an on-off switch 400.

The control board 200 is mounted in the box 100 and includes a communication module, a vehicle control module, a charge control module, and a motor control module. The vehicle control module controls operation of a vehicle according to signals of the communication module. The driver board 300 is mounted in the box 100. The control board 200 is connected to the driver board 300. The motor control module controls a motor of the vehicle through the driver board 300. The on-off switch 400 is mounted in the box 100 and is connected to the control board 200. The on-off switch 400 has an input end and an output end. The charge control module controls on-off of the input end and the output end. The output end is connected to an energy storage member of the vehicle (not shown). The input end is connected to a charging cable 430 of the energy storage member. The on-off switch 400 may be a relay or a contactor. The energy storage member may be a storage battery.

For example, functions of the vehicle control module may include driving torque control, optimized control of braking energy, energy management of the whole vehicle, maintenance and management of a vehicular network, fault diagnosis and treatment, vehicle state monitoring, and the like. The vehicle control module is connected to a center controller of the vehicle. The charge control module can protect the energy storage member, and can prevent the energy storage member from being overcharged while charging the energy storage member.

According to the vehicle controller 1 in this embodiment of the present disclosure, the control board 200 is mounted in the box 100 and includes the communication module, the vehicle control module, the charge control module, and the motor control module. The vehicle control module controls operation of the vehicle according to signals of the communication module. The communication module is configured to receive and send various operation signals of the vehicle and may be connected to the vehicle control module, the charge control module, and the motor control module all. The vehicle control module is further connected to the charge control module and the motor control module, respectively.

It should be understood that the communication module, the vehicle control module, the charge control module, and the motor control module in this embodiment of the present disclosure are all integrated into the same control board 200. That is, the control board 200 has the vehicle control function, the charge control function, and the motor control function. The control board 200 features high integration level and more functions. Therefore, the communication module, the vehicle control module, the charge control module, and the motor control module can be disassembled and assembled simply by disassembling and assembling the control board 200. Compared with the communication module, the vehicle control module, the charge control module, and the motor control module separately arranged in the related art, the vehicle controller 1 in this embodiment of the present disclosure features higher disassembling and assembling efficiency. Moreover, it is unnecessary to additionally arrange conductive members such as conductors or conducting bars to connect the four control modules. Therefore, the number of parts is reduced, and the disassembling and assembling steps are further simplified. Moreover, the above four modules may be mounted on a same box 100. The number of the boxes 100 is reduced and the overall size of the box bodies is reduced. The box 100 can be integrally configured, which contributes to miniaturization of the vehicle controller 1.

Furthermore, when the energy storage member supplies power to the control board 200, the energy storage member can supply power to the communication module, the vehicle control module, the charge control module, and the motor control module at the same time, without supplying power to the four modules separately, which contributes to reducing the number of parts and reducing the cost.

In addition, the driver board 300 is mounted in the box 100. The control board 200 is connected to the driver board 300. The motor control module controls the motor of the vehicle through the driver board 300. For example, the control board 200 sends a control signal to the driver board 300. The driver board 300 can drive the motor of the vehicle to operate at different rotating speeds. The control board 200 can receive a feedback signal by the communication module during operation of the motor of the vehicle, so as to adjust control of the rotating speed of the motor of the vehicle timely. The control board 200 and the driver board 300 may be connected to each other through a conductive member such as a conductor or a plug connector.

The control board 200 and the driver board 300 may be connected and fixed to the box 100, respectively, so that electric connection is more reliable. Meanwhile, the conductive member for connecting the control board 200 and the driver board 300 may be hidden in the box 100, so that the electric connection features higher safety. The box 100 can provide the control board 200 with the electromagnetic shielding effect, so that signals received and transmitted by the control board 200 are small in fluctuation.

In addition, the on-off switch 400 is mounted in the box 100 and is connected to the control board 200. The on-off switch 400 has the input end and the output end. The charge control module controls on-off of the input end and the output end. The output end is connected to the energy storage member of the vehicle. The input end is connected to the charging cable 430 of the energy storage member. The energy storage member of the vehicle may be a storage battery, and can transmit electric energy to the vehicle controller 1, so as to realize normal operation of the vehicle controller 1.

In an embodiment, when the energy storage member is charged, the input end and the output end are communicated; and when charging of the energy storage member is stopped, the input end and the output end are disconnected. The communication module can receive charging conditions of the energy storage member. The vehicle control module controls on-off of the input end and the output end through the charge control module. For example, when the energy storage member is fully charged or fails to charge, the charge control module can disconnect the input end and the output end to further interrupt charge of the energy storage member, so as to protect the energy storage member with high charging safety.

The charging cable 430 may be connected to a charging pile outside the vehicle through an on-board charger.

Therefore, the vehicle controller 1 according to this embodiment of the present disclosure is capable of integrating vehicle control function, a charge control function, and a motor control function into the same control board 200, and has the advantages of high integration level, few parts, good shielding effect, reliable electric connection, and the like.

Figure 2:
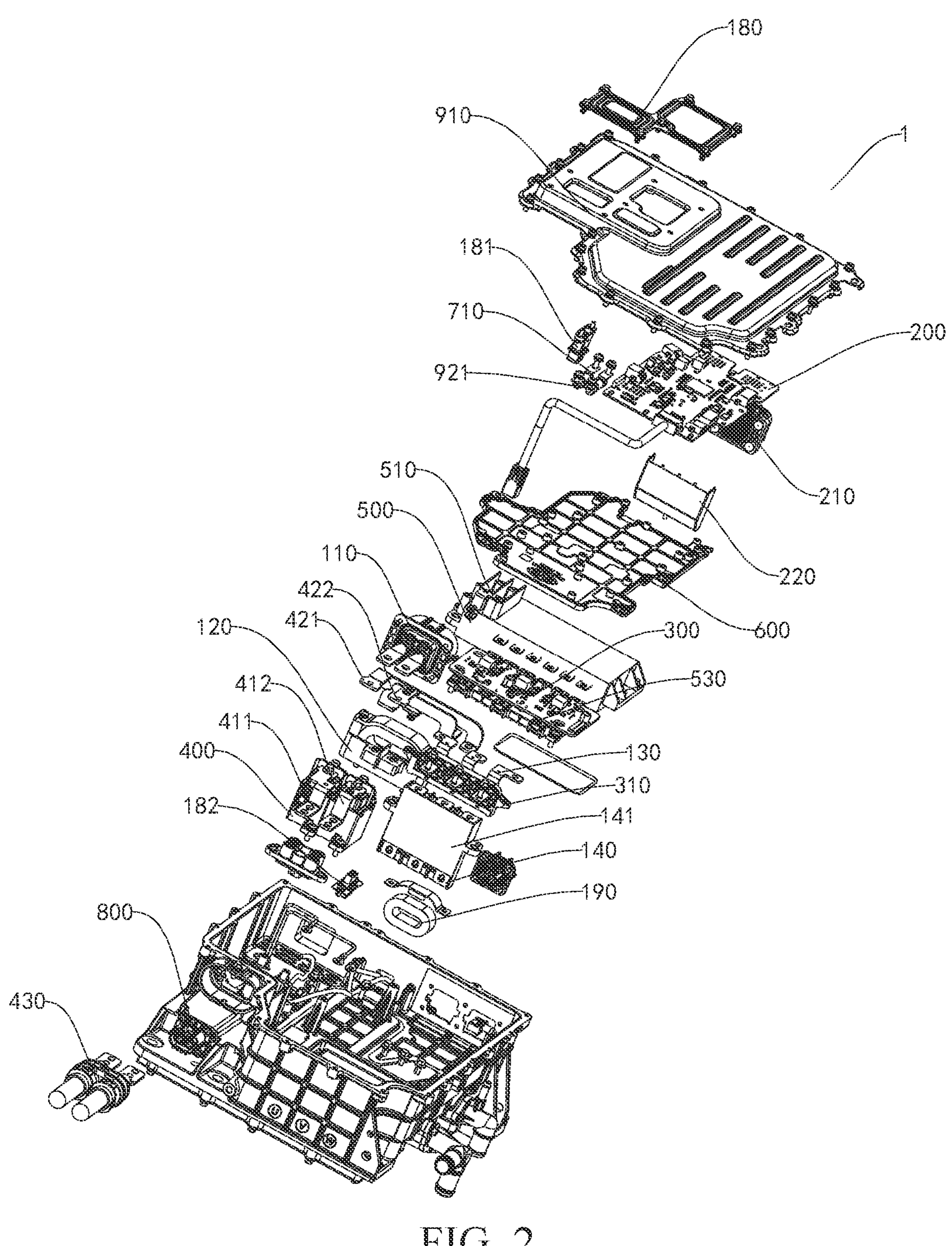
FIG. 2 is an exploded view of the vehicle controller according to the embodiment of the present disclosure.

According to some embodiments of the present disclosure, as shown in FIG. 1 and FIG. 2, the communication module includes a signal plug connector 210. The signal plug connector 210 is exposed from the box 100. The signal plug connector 210 has a plugging area 211 for signal transmission. In an embodiment, the plugging area 211 is exposed from the box 100, so that signal transmission between the control board 200 and other structures of the vehicle is facilitated.

In addition, the control board 200 is provided with a signal shielding cover 220. The signal shielding cover 220 can accelerate attenuation of electronic noise. The signal shielding cover 220 can enclose the part of the signal plug connector 210 except for the plugging area 211, such that the signal shielding cover 220 covers a portion of the signal plug connector 210 and exposes the plugging area 211. Therefore, a condition that noise generated by other electron devices interferes with signals received and sent by the signal plug connector 210 can be avoided, and fluctuation of the signals transmitted by the signal plug connector 210 is reduced, so that the control board 200 controls the vehicle effectively. Therefore, the driving safety is improved.

According to some embodiments of the present disclosure, as shown in FIG. 2, the input end is connected to a positive charging bar 411 and a negative charging bar 412. A positive pole of the charging cable 430 is connected to the positive charging bar 411. A negative pole of the charging cable 430 is connected to the negative charging bar 412. The charging cable 430 passes through the box 100. The output end is connected to a positive direct current bar 421 and a negative direct current bar 422. A direct current plug connector 110 is mounted on the box 100. The direct current plug connector 110 is exposed from the box 100. The positive direct current bar 421 and the negative direct current bar 422 are both connected to one end (e.g., a first end) of the direct current plug connector 110. Another end (e.g., a second end) of the direct current plug connector 110 is connected to the energy storage member.

For example, the direct current plug connector 110 may be fixedly connected to the box 100. The end of the direct current plug connector 110 exposed from the box 100 is connected to the energy storage member. The energy storage member is in plugging connection to the direct current plug connector 110. As the energy storage member is arranged/disposed outside the box 100, by configuring the direct current plug connector 110, electric connection between the energy storage member and the vehicle controller 1 is more stable. Moreover, the positive charging bar 411 and the negative charging bar 412 may be integrally formed and may be not electrically connected. For example, the positive charging bar 411 and the negative charging bar 412 are formed by injection molding. The positive direct current bar 421 and the negative direct current bar 422 may be integrally formed and may be not electrically connected. For example, the positive direct current bar 421 and the negative direct current bar 422 are formed by injection molding. The positive charging bar 411, the negative charging bar 412, the positive direct current bar 421, and the negative direct current bar 422 all may be made from metallic copper.

By configuring the positive charging bar 411, the negative charging bar 412, the positive direct current bar 421, and the negative direct current bar 422, the charging cable 430 may be electrically connected to the energy storage member. As rigidity of the conducting bar is higher than that of the conductor, stability of relative positions between the box 100 and the four conducting bars can be improved, so that structural and electrical connection reliability of the vehicle controller 1 are improved.

In some embodiments of the present disclosure, as shown in FIG. 2, a first magnet ring 120 is mounted on the box 100. The positive direct current bar 421 and the negative direct current bar 422 both pass through the first magnet ring 120. That is, both currents flowing through the positive direct current bar 421 and the negative direct current bar 422 need to pass through the first magnet ring 120. By additionally disposing the first magnet ring 120, the currents flowing through the positive direct current bar 421 and the negative direct current bar 422 can be effectively inhibited from generating noise, so that electromagnetic compatibility is optimized.

According to some embodiments of the present disclosure, as shown in FIG. 2, the vehicle controller 1 further includes a direct current plug connector 110, a capacitor 500, and an IGBT module (530) (Insulated Gate Bipolar Transistor).

The direct current plug connector 110 is mounted on the box 100 and is connected to the energy storage member. The capacitor 500 is mounted on the box 100 and has a capacitor input end 510 and a capacitor output end. The direct current plug connector 110 is connected to the capacitor input end 510. The energy storage member can input electric energy into the capacitor 500 through the direct current plug connector 110. With the capacitor 500, the direct current flowing to the IGBT module 530 is less in fluctuation. A condition that the IGBT module 530 is damaged due to high current fluctuation is avoided, so that the service life of the IGBT module 530 is prolonged.

The IGBT module 530 is mounted on the box 100 and has a direct current input end, an alternating current output end, and a signal output end. The direct current input end is connected to the capacitor output end. The capacitor 500 can output a direct current to the IGBT module 530 through the capacitor output end and the direct current input end. The signal output end is connected to the driver board 300. The IGBT module 530 can transmit electric signals to or receive electric signals from the driver board 300 through the signal output end. The alternating output end is connected to a three-phase input end of the motor of the vehicle. The IGBT module 530 can convert the direct current into an alternating current. The IGBT module 530 outputs a three-phase alternating current to the motor of the vehicle through the alternating current output end to drive the motor to operate, so that the vehicle operates normally.

Figure 3:
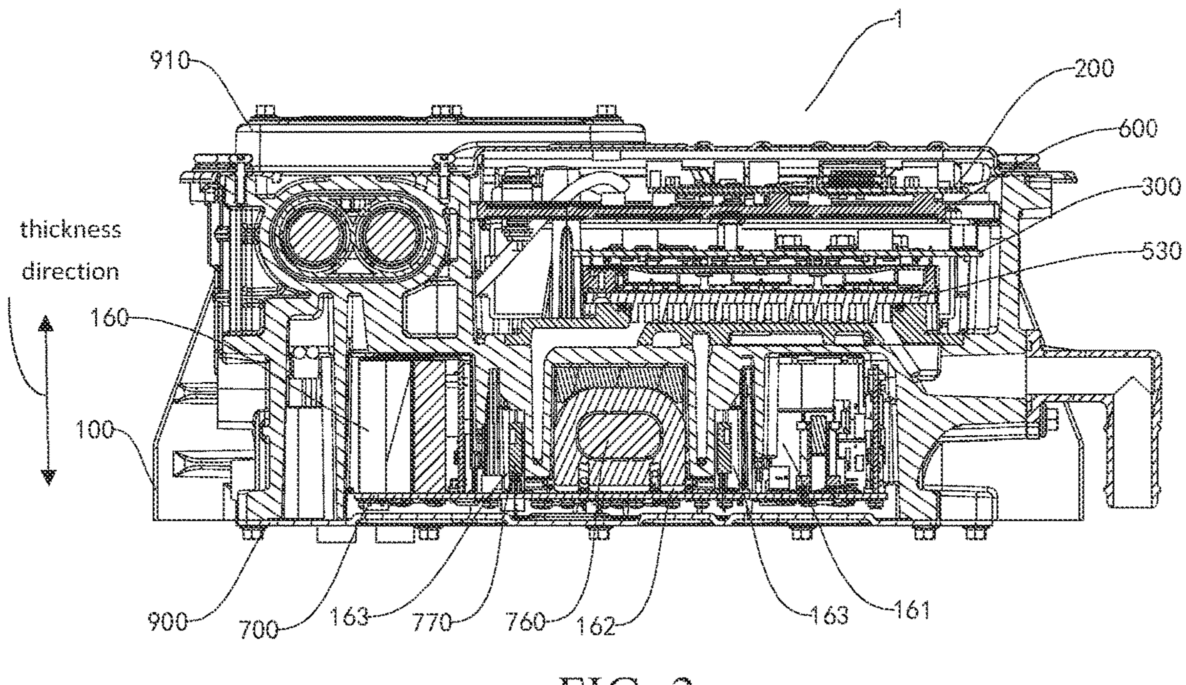
FIG. 3 is a sectional view of the vehicle controller according to the embodiment of the present disclosure.

In some embodiments of the present disclosure, as shown in FIG. 2 and FIG. 3, the vehicle controller 1 further includes an electromagnetic shielding slab 600. The electromagnetic shielding slab 600 is mounted on the box 100. The control board 200 is located on a side (e.g., a first surface) of the electromagnetic shielding slab 600 facing away from the box 100. The driver board 300, the capacitor 500, and the IGBT module 530 are located on a side (e.g., a second surface) of the electromagnetic shielding slab 600 facing the box 100.

In other words, the electromagnetic shielding slab 600 may separate the control board 200 from the driver board 300, the capacitor 500, and the IGBT module 530. That is, the driver board 300, the capacitor 500, and the IGBT module 530, and the control board 200 are respectively arranged/disposed on two opposite sides of the electromagnetic shielding slab 600. The electromagnetic shielding slab 600 may be a metal member. The electromagnetic shielding slab 600 can accelerate attenuation of electronic noise and prevent the driver board 300, the capacitor 500, and the IGBT module 530 from interfering with the control board 200, so that signal transmission reliability of the control board 200 is high. Moreover, the electromagnetic shielding slab 600 may further be used for supporting the control board 200, so as to fix the control board 200 to the vehicle controller 1.

In an embodiment, as shown in FIG. 2, a three-phase adapter bar 130 and a three-phase conductive member 140 are mounted on the box 100. The three-phase conductive member 140 is wrapped by an insulating member 141. Both ends (e.g., a first end and a second end) of the three-phase adapter bar 130 are respectively connected to the alternating current output end of the IGBT module 530 and one end (e.g., a second end) of the three-phase conductive member 140. Another end (e.g., a first end) of the three-phase conductive member 140 is connected to the three-phase input end of the motor.

For example, the three-phase adapter bar 130 and the three-phase conductive member 140 may be made from metallic copper. The three-phase adapter bar 130 and the three-phase conductive member 140 are high in rigidity. Compared with the conductor, relative positions of the conducting bar and the box 100 are more stable, so that electric connection is more reliable. The insulating member 141 may be injection-molded to the three-phase conductive member 140. Both ends of the three-phase conductive member 140 are exposed from the insulating member 141, so that electric connection is achieved conveniently. Meanwhile, the insulating member 141 may enclose a main body portion between both ends of the three-phase conductive member 140 to prevent electric conduction between the three-phase conductive member 140 and other parts, so that safety of the electric connection is higher.

In addition, the driver board 300 is provided with a Hall element 310. The three-phase adapter bar 130 passes through the Hall element 310. The Hall element 310 can detect a current and a voltage of the motor. The driver board 300 can transfer the signals detected by the Hall element 310 to the control board 200, so that the control board 200 can adjust control of the motor timely. The control precision is improved.

Figure 4:
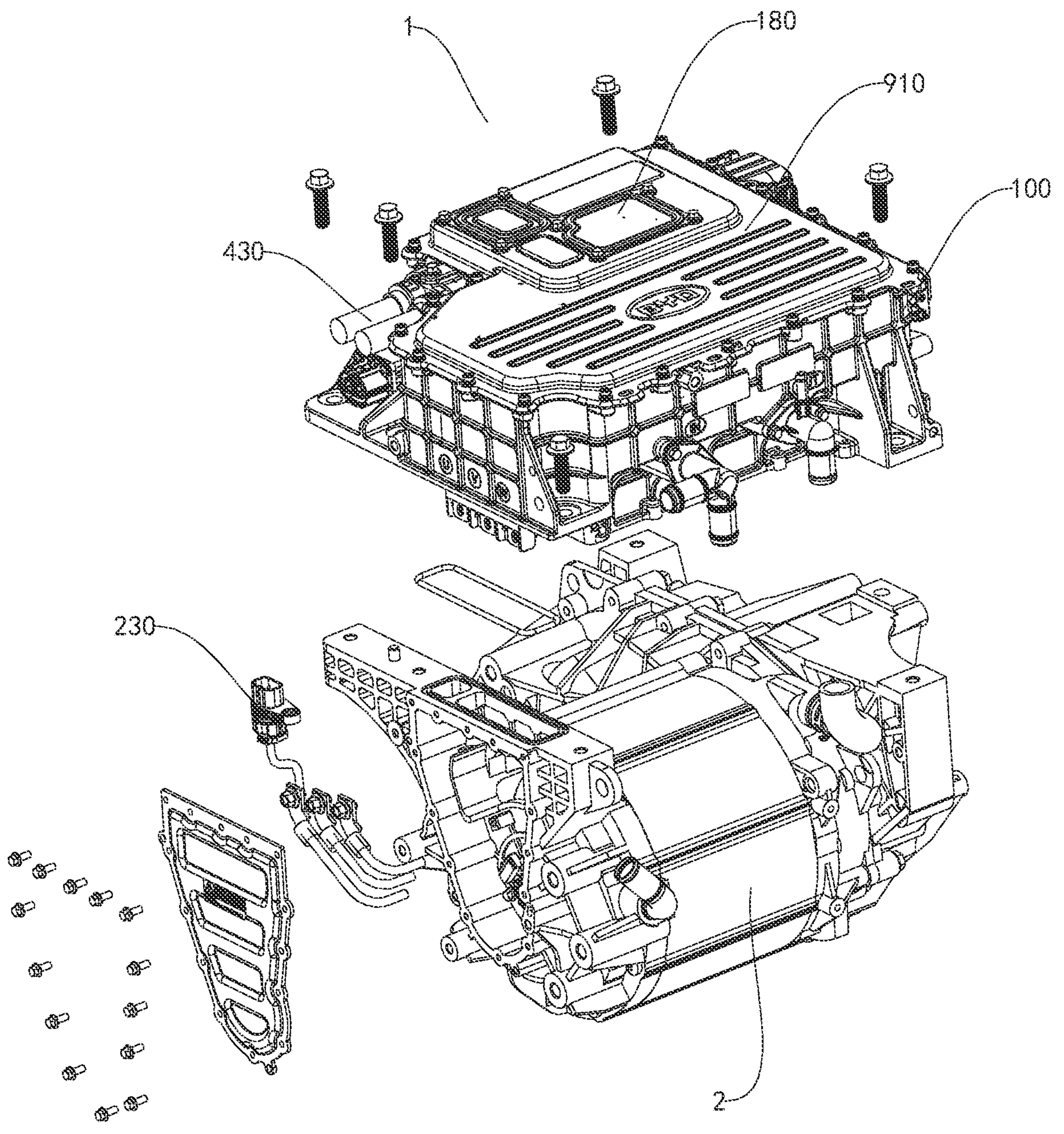
FIG. 4 is an exploded view of the vehicle controller and a power box according to the embodiment of the present disclosure.

According to some embodiments of the present disclosure, as shown in FIG. 4, the control board 200 is connected to a resolver plug connector 230. The resolver plug connector 230 passes through the box 100 and is connected to the motor of the vehicle. The resolver plug connector 230 is used for detecting an angular displacement and an angular velocity of the motor.

The resolver plug connector 230 may be fixed to the box 100, so that the vehicle controller 1 is stable in structure. The real-time working state of the motor can be detected through the resolver plug connector 230. The working state is fed back to the control board 200, so that the control board 200 can adjust the angular displacement and the angular velocity of the motor timely through the driver board 300. Therefore, the vehicle drives stably.

According to some embodiments of the present disclosure, as shown in FIG. 2, the vehicle controller 1 further includes a direct current plug connector 110, a power board 700, an alternating current output plug connector 800, and a direct current output plug connector 814.

The direct current plug connector 110 is mounted on the box 100 and is connected to the energy storage member. The power board 700 is connected to a positive power line, a negative power line, a power signal line 780, an alternating current adapter end, and a direct current adapter end. The positive power line and the negative power line are both connected to the direct current plug connector 110. The energy storage member inputs the current to the power board 700 through the positive power line and the negative power line. The power signal line 780 is connected to the communication module to feed an electric energy state of the power board 700 back to the control board 200.

Moreover, the alternating current output plug connector 800 is connected to the alternating current adapter end and is mounted on the box 100. The alternating current output plug connector 800 is exposed from the box 100, so that the alternating current output plug connector 800 is connected to an electronic device outside the box 100. The power board 700 can convert the direct current inputted by the energy storage member into the alternating current, and then supplies power to the electronic device needing the alternating current in the vehicle through the alternating current output plug connector 800. Meanwhile, the direct current output plug connector 814 is mounted on the box 100 and is connected to a direct current adapter bar 811 and a direct current filter board 813. The direct current filter board 813 can inhibit electronic noise, so that the direct current output by the direct current output plug connector 814 is more stable.

In an embodiment, the direct current filter board 813 is connected to the direct current adapter end. The current flows from the direct current filter board 813 to the direct current adapter bar 811, and is then output through the direct current output plug connector 814. That is, the direct current output plug connector 814 is indirectly connected to other portions of the power board 700 through the direct current adapter bar 811 and the direct current filter board 813. The direct current output plug connector 814 is exposed from the box, so that the direct current output plug connector 814 is conveniently connected to the electronic device outside the box 100.

The power board 700 can convert the direct current inputted by the energy storage member into direct currents with different powers. That is, the direct current inputted to the power board 700 and the direct current output by the power board 700 are different in power. The direct current output plug connector 814 supplies power to the electronic device needing the direct current with such power in the vehicle.

According to some embodiments of the present disclosure, as shown in FIG. 3, the power board 700 is arranged/disposing adjacent to a side (e.g., a first surface) of the box 100 in a thickness direction of the box 100. The control board 200 and the driver board 300 are arranged/disposed adjacent to another side (e.g., a second surface) of the box 100 in the thickness direction of the box 100.

In an embodiment, spaces capable of accommodating parts can be constructed on two opposite sides of the box 100 in the thickness direction. Thus, distances between the power board 700 and the control board 200 and between the power board and the driver board 300 can further be increased while the box 100 can accommodate the power board 700, the control board 200, and the driver board 300. Therefore, electromagnetic interference of the power board 700 to the control board 200 and the driver board 300 can be reduced, so that electromagnetic compatibility is improved.

In some embodiments of the present disclosure, as shown in FIG. 1 to FIG. 3, the vehicle controller 1 further includes a first cover plate 900 and a second cover plate 910.

The first cover plate 900 is mounted on one side of the box 100 in the thickness direction and seals the power board 700 in the box 100. The second cover plate 910 is located on another side of the box 100 in the thickness direction and seals the control board 200 and the driver board 300 in the box 100.

By disposing the first cover plate 900 and the second cover plate 910, the power board 700, the control board 200, and the driver board 300 can be disassembled and assembled conveniently. The first cover plate 900 seals the power board 700. The second cover plate 910 seals the control board 200 and the driver board 300. The power board 700, the control board 200, and the driver board 300 can not only be prevented from being separated from the box 100, but also be prevented from being damaged due to collision. The power board 700, the control board 200, and the driver board 300 are prevented from interfering with the electronic device outside the vehicle controller 1.

Figure 8:
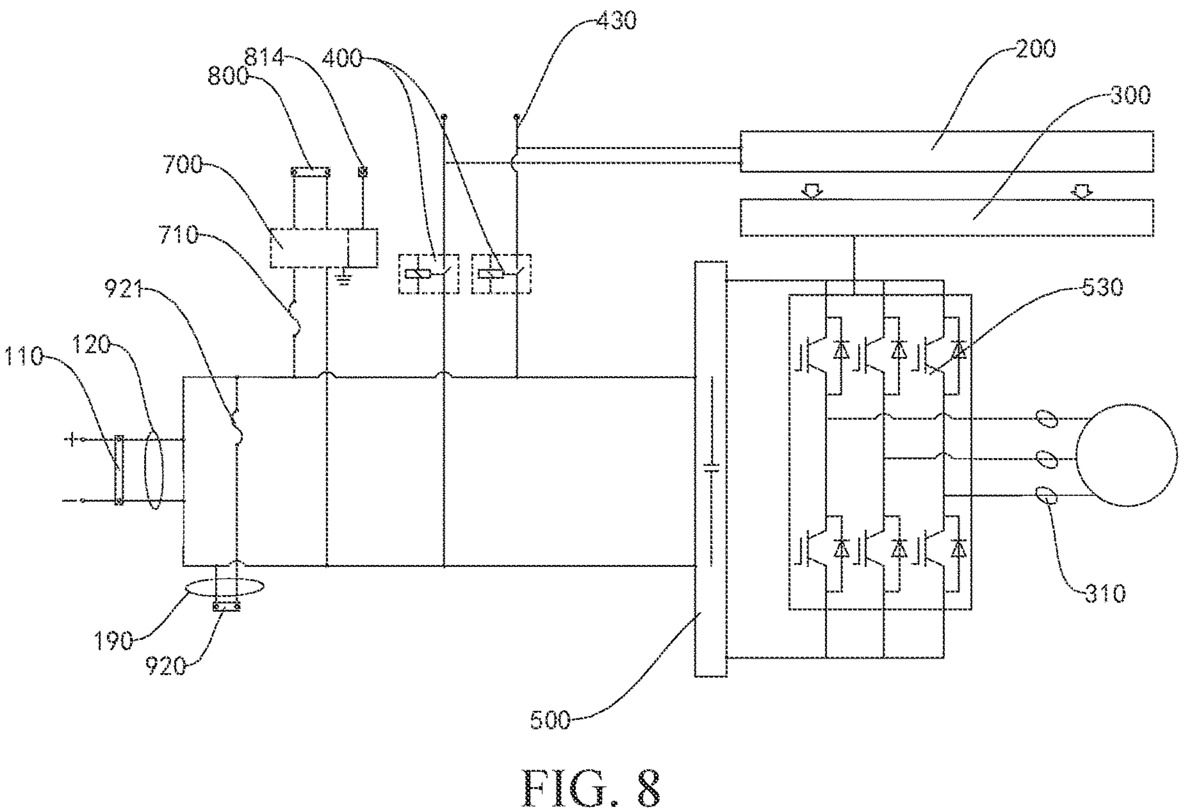
FIG. 8 is a schematic view of a circuit of the vehicle controller according to the embodiment of the present disclosure.

According to some embodiments of the present disclosure, as shown in FIG. 8, the positive power line of the power board 700 is connected to a first electric protection member 710. The first electric protection member 710 is connected to the direct current plug connector 110.

For example, the first electric protection member 710 may be a fuse. In this way, when a current or voltage transmitted by the positive power line is too high, the first electric protection member 710 itself may be fused, so that a circuit is short-circuited, and transmission of the current to the power board 700 is cut off. Therefore, the power board 700 is protected, and the power board 700 is prevented from being damaged due to overcurrent.

Figure 5:
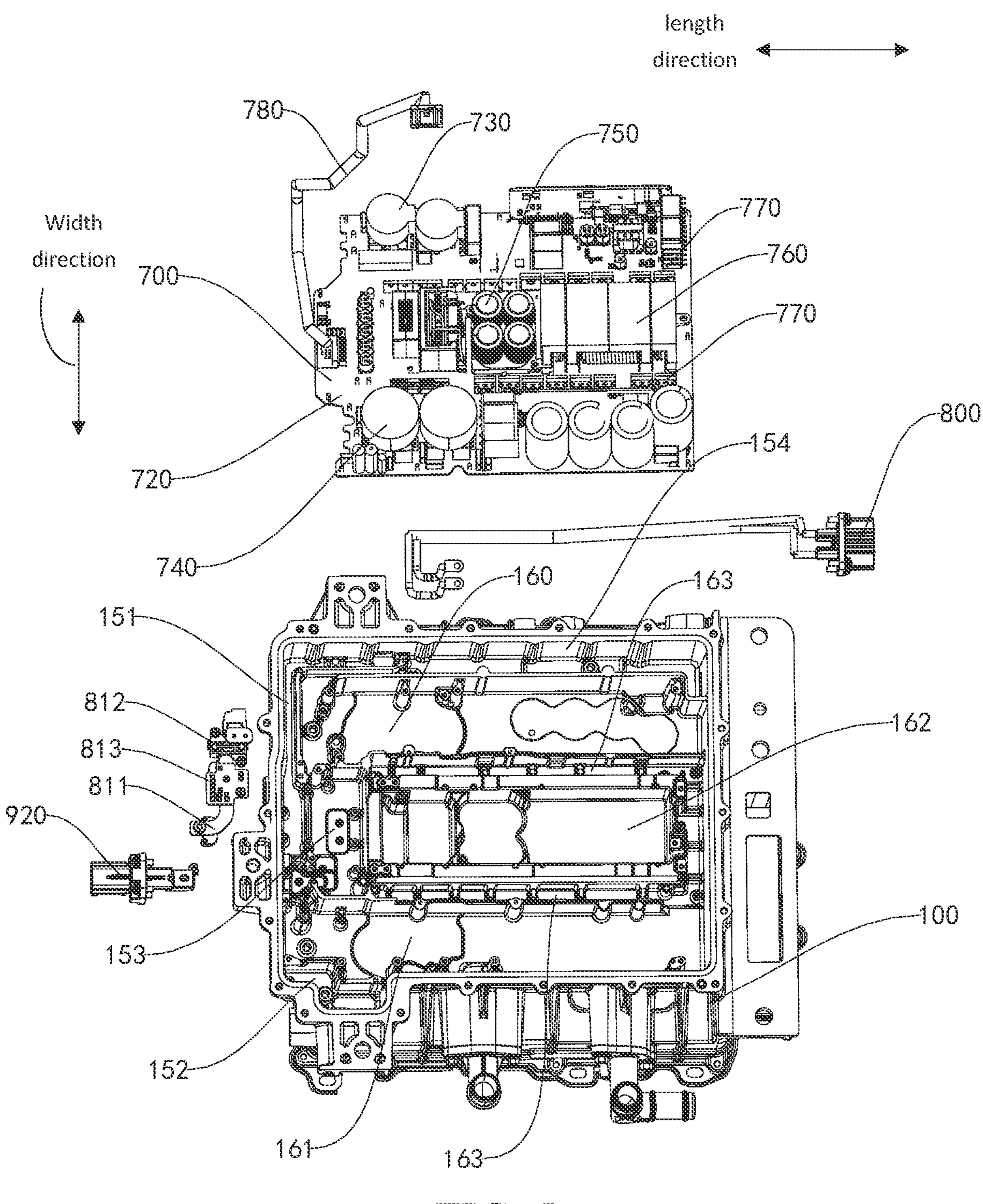
FIG. 5 is an exploded view of a box and a power board of the vehicle controller according to the embodiment of the present application.

According to some embodiments of the present disclosure, as shown in FIG. 5, a second magnet ring 812 surrounds a peripheral surface of the direct current adapter bar 811. The second magnet ring 812 may sleeve the direct current adapter bar 811. By additionally disposing the second magnet ring 812, the current flowing through the direct current adapter bar 811 can be effectively inhibited from generating noise, so that the direct current output by the direct current output plug connector 814 is less in fluctuation.

Figure 6:
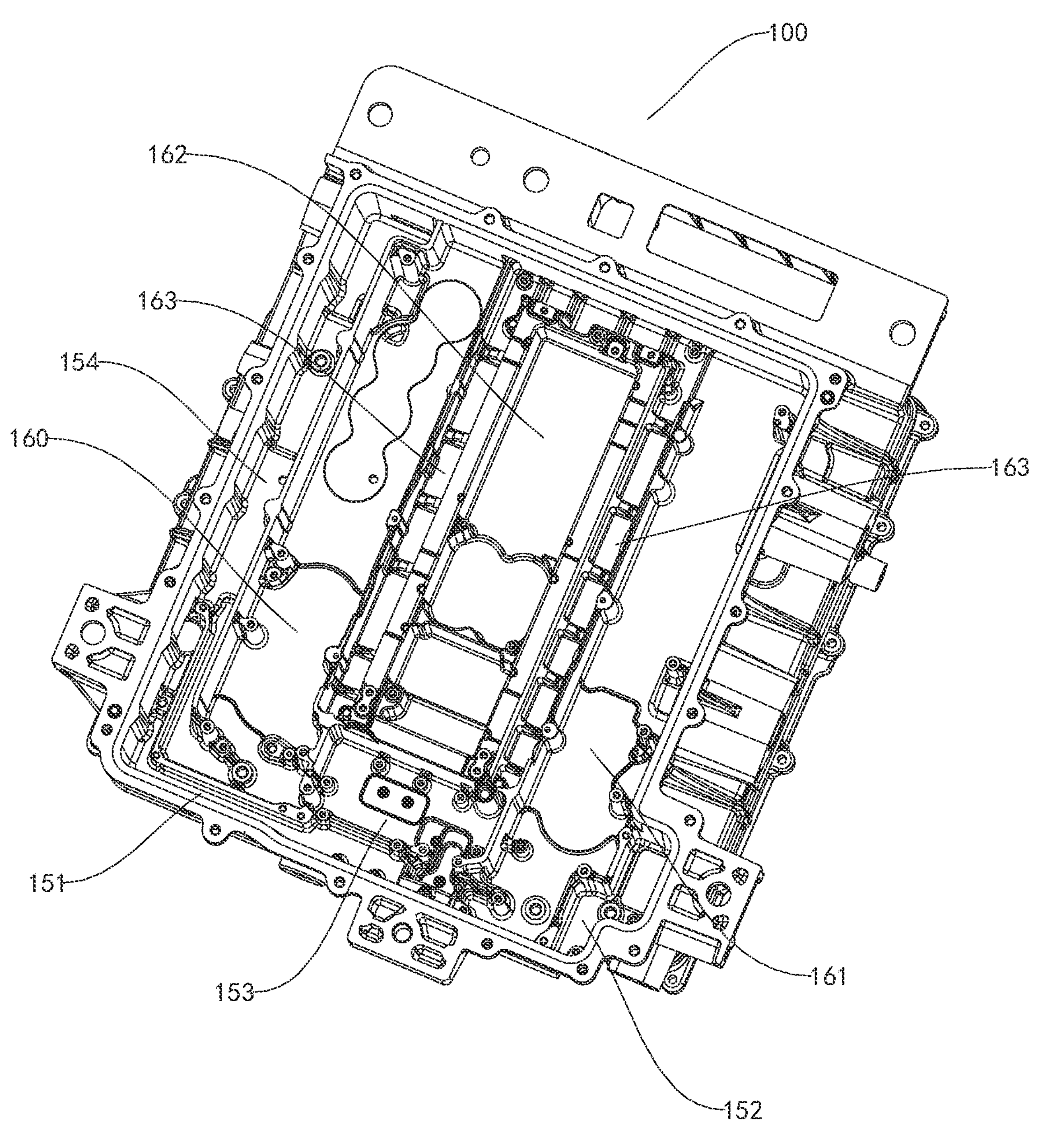
FIG. 6 is a schematic structural diagram of the box of the vehicle controller according to the embodiment of the present disclosure.
Figure 7:
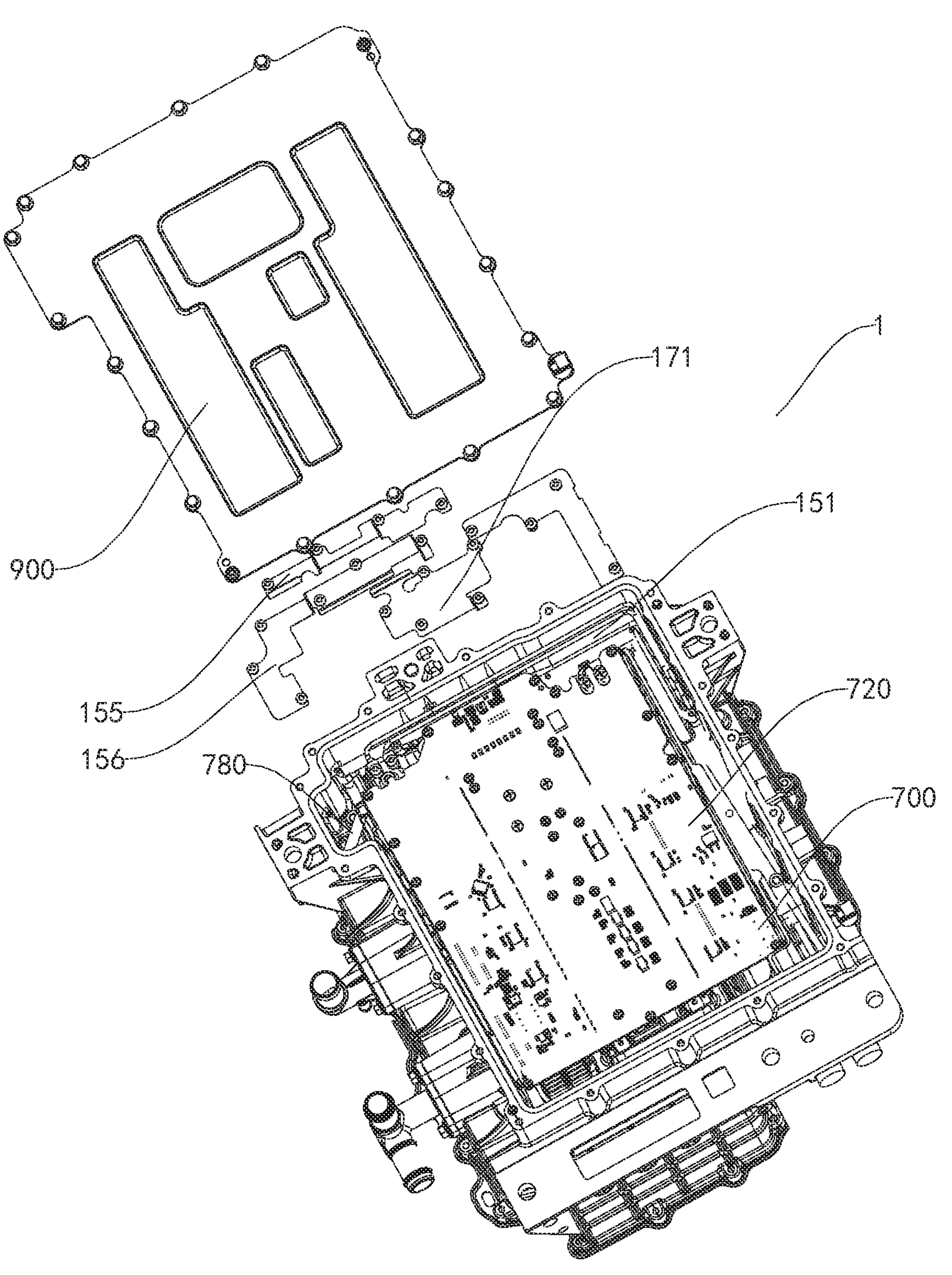
FIG. 7 is an exploded view of the box and a first cover plate of the vehicle controller according to the embodiment of the present disclosure.

According to some embodiments of the present disclosure, as shown in FIG. 6 and FIG. 7, an alternating current shielding cavity 154, a power line shielding cavity 151, a power signal line shielding cavity 152, and the direct current output shielding cavity 153 are arranged/disposed on a side surface of the box 100 facing the power board 700.

A conductor of the alternating current output plug connector 800 is located in the alternating current shielding cavity 154. The alternating current shielding cavity 154 can accommodate the conductor of the alternating current output plug connector 800 and prevent the conductor from physically interfering with other parts, so that electric connection is more stable. The alternating current shielding slab is mounted on the box 100. The alternating current shielding slab seals the alternating current shielding cavity 154. That is, the alternating current shielding cavity 154 and the alternating current shielding slab close the conductor jointly, which can not only prevent the conductor from being separated from the alternating current shielding cavity 154, but also reduce electronic noise generated by the conductor outside the alternating current shielding cavity 154.

The positive power line and the negative power line are located in the power line shielding cavity 151. The power signal line 780 is located in the power signal line shielding cavity 152. The power line shielding cavity 151 can accommodate the positive power line and the negative power line to prevent the two power lines from physically interfering with other parts, so that electric connection is more stable. The power line cover plate 155 seals the power line shielding cavity 151. The signal line cover plate 156 seals the power signal line shielding cavity 152. Therefore, this can not only prevent the two power lines from being separated from the power line shielding cavity 151, but also reduce the electronic noise generated by the two power lines outside the power line shielding cavity 151.

The direct current adapter bar 811 and the direct current filter board 813 are located in the direct current output shielding cavity 153. The direct current output shielding cavity 153 can accommodate the direct current adapter bar 811 and the direct current filter board 813 to prevent the direct current adapter bar 811 and the direct current filter board 813 from physically interfering with other parts, so that electric connection is more stable. A direct current shielding slab 171 is mounted on the box 100. The direct current shielding slab 171 seals a direct current output shielding cavity 183. In this way, this guarantees the shielding effect of the direct current output shielding cavity 153 and also prevents the direct current adapter bar 811 and the direct current filter board 813 from being separated from the direct current output shielding cavity 183.

By configuring the multiple cavities in a spaced manner, mutual interference among the above multiple electronic devices can also be avoided, so that electromagnetic compatibility is further optimized.

According to some embodiments of the present disclosure, as shown in FIG. 5, the power board 700 includes a board 720, an alternating current inductor 730, a direct current inductor 740, a transformer inductor 750, a transformer 760, and an MOS device 770.

The positive power line, the negative power line, the power signal line 780, the alternating current adapter end, and the direct current adapter end are all arranged/disposed on the board 720. The alternating current inductor 730 and the direct current inductor 740 are mounted on both edges of the board 720 in the width direction. The alternating current inductor 730, the direct current inductor 740, and the power signal line 780 are located at a same end of the board 720 in the length direction of the board 720. The transformer 760 is mounted on the board 720, and is located between the alternating current inductor 730 and the direct current inductor 740 in the width direction of the board 720. The transformer 760 is mounted on the board 720 and is located at an end of the board 720 away from the power signal line 780. The MOS devices 770 are mounted on the board 720, and are located on both ends of the transformer 760 in the width direction of the board 720.

The above multiple power lines, multiple inductors, the power signal line 780 and multiple MOS devices 770 are integrated on the board 720. That is, one board 720 may be used for mounting multiple electronic devices, so that the power board 700 is high in the integration level. The power board 700 is disassembled and assembled integrally simply by disassembling and assembling the board 720.

By configuring the transformer 760 and the power signal line 780 at both ends of the board 720, a distance between the transformer 760 and the power signal line 780 is far. Electromagnetic interference of the transformer 760 to the power signal line 780 is small. Moreover, according to the configuration mode of the power board 700, the power board 700 is more compact in structure, which contributes to reducing volume of the power board 700.

In this way, the power board 700 can output both the direct current and the alternating current. Moreover, the output direct current and the input direct current are different in voltage.

In some embodiments of the present disclosure, as shown in FIG. 6, a direct current inductance shielding cavity 160, an alternating current inductance shielding cavity 161, a transformer inductance shielding cavity 162, and an MOS device shielding cavity 163 are arranged/disposed on a side surface of the box 100 facing the power board 700.

The direct current inductor 740 is located in the direct current inductance shielding cavity 160. The alternating current inductor 730 is located in the alternating current inductance shielding cavity 161. The transformer inductor 750 is located in the transformer inductance shielding cavity 162. The MOS device 770 is located in the MOS device shielding cavity 163. By configuring the multiple independent shielding cavities, the alternating current inductor 730, the direct current inductor 740, the transformer inductor 750, and the MOS device 770 may be respectively located in different shielding cavities. Electromagnetic interference among the alternating current inductor 730, the direct current inductor 740, the transformer inductor 750, and the MOS device 770 is small. Electromagnetic interference to the outside is also small, which contributes to improving integral electromagnetic compatibility.

Moreover, the board 720 seals the direct current inductance shielding cavity 160, the alternating current inductance shielding cavity 161, the transformer inductance shielding cavity 162, and the MOS device shielding cavity 163, so that the transformer, the multiple inductors, and the multiple MOS devices 770 can be prevented from being separated from their shielding cavities, with high position stability.

According to some embodiments of the present disclosure, as shown in FIG. 1 and FIG. 2, a detachable maintenance board 180 is mounted on the box 100. A first electrical connector 181 is mounted on the maintenance board 180. A second electrical connector 182 in contact conduction with the first electrical connector 181 is mounted on the box 100. The control board 200 detects on-off of the first electrical connector 181 and the second electrical connector 182 to control on-off of a circuit of the energy storage member.

For example, the maintenance board 180 is detachably mounted on the second cover plate 910. The first electrical connector 181 is mounted on a side, of the maintenance board 180 facing the box 100. The second electrical connector 182 may be mounted on the capacitor 500. In this way, when the maintenance board 180 is mounted on the box 100, the first electrical connector 181 and the second electrical connector 182 are electrically conducted, so that the vehicle controller 1 works normally. In cases where the vehicle controller 1 needs to be maintained or detected, and the like, the maintenance board 180 is detached first. In this case, the first electrical connector 181 and the second electrical connector 182 are separated. The control board 200 can detect that the first electrical connector 181 and the second electrical connector 182 are disconnected. Electromagnetic switches such as a relay or a contactor may be arranged/disposed between the energy storage member and the direct current plug connector 110. Once detecting that the first electrical connector 181 and the second electrical connector 182 are disconnected, the control board 200 controls the relay or the contactor between the energy storage member and the direct current plug connector 110 to be disconnected to power off the whole vehicle controller 1, thereby protecting maintenance personnel may be protected and facilitating maintenance and inspection of the vehicle controller 1.

In some embodiments of the present application, as shown in FIG. 1, the vehicle controller 1 further includes the direct current plug connector 110 and a power supply plug connector 920.

The direct current plug connector 110 is mounted on the box 100 and is connected to the energy storage member. The power supply plug connector 920 is mounted on the box 100 and exposed from the box 100. The power supply plug connector 920 is connected to a positive heating wire and a negative heating wire. The positive heating wire and the negative heating wire are both connected to the direct current plug connector 110. The power supply plug connector 920 is connected to a heating member for heating the energy storage member.

After the power supply plug connector 920, the energy storage member, and the heating member are connected and conducted, the energy storage member can supply power to the heating member through the power supply plug connector 920, so that the heating member generates heat. The heating member may be close to the energy storage member to further heat the energy storage member. It is understood that in a low temperature environment, for example, winter, performance such as energy storage characteristic and power supply characteristic of the energy storage member may decline to affect vehicle driving. By additionally disposing the heating member, the energy storage member may be kept at an appropriate temperature, so that service performance of the energy storage member is guaranteed.

According to some embodiments of the present disclosure, as shown in FIG. 8, a third magnet ring 190 is mounted on the box. The positive heating wire and the negative heating wire both pass through the third magnet ring 190. In this way, noise generated by the current flowing through the positive heating wire and the negative heating wire may be inhibited, so that the current output to the heating member is more stable, and the heating member is prevented from being damaged.

Moreover, the positive heating wire is connected to a second electric protection member 921. The second electric protection member 921 is connected to the direct current plug connector 110. The second electric protection member 921 may be a fuse. In this way, when the current or voltage flowing to the positive heating wire is too high, the second electric protection member 921 itself may be fused, so that the circuit is short-circuited, and transmission of the current is cut off. Therefore, the heating member is protected, and the heating member is prevented from being damaged due to overcurrent.

In an embodiment, the power supply plug connector 920 is connected to a compressor of a vehicle air-conditioner. In this way, the energy storage member can be connected to the compressor through the power supply plug connector 920. That is, the energy storage member can supply power to both the compressor and the heating member through the power supply plug connector 920, which enables the compressor works normally to adjust an internal temperature of the vehicle, and also enables the heating member to generate. A utilization ratio of the power supply plug connector 920 is improved, and the number of parts of the vehicle controller 1 is reduced.

The vehicle according to this embodiment of the disclosure is described below with reference to the drawings.

The vehicle according to this embodiment of the present invention includes the vehicle controller 1, the power box 2, the motor, the transmission, and the energy storage member according to the foregoing embodiments of the present disclosure.

The power box 2 is mounted on the box 100 of the vehicle controller 1. The motor and the transmission are in transmission connection and are mounted on the power box 2. The motor is connected to the IGBT module 530. For example, the power box 2 is arranged/disposed on a side of the power board 700 facing away from the box 100. The power box 2 can be used for fixing and sheltering the motor and the transmission so as to prevent the motor and the transmission from being damaged.

The motor is electrically connected to the driver board 300. The driver board 300 can drive the motor to operate. The energy storage member is connected to the output end of the on-off switch 400. A current of an external power supply passes through the on-off switch 400 and then flows to the energy storage member to charge the energy storage member. The on-off switch 400 is arranged/disposed between the energy storage member and the external power supply, so that on-off of the external power supply and the energy storage member can be effectively controlled. Therefore, the energy storage member is prevented from being overcharged.

The vehicle according to this embodiment of the present disclosure has the advantages of high integration level, few parts, good shielding effect, reliable electric connection, and the like using the vehicle controller 1 according to this embodiment of the present disclosure.

Other compositions and operations of the vehicle controller 1 and the vehicle with the same according to the embodiments of the present disclosure are known to those of ordinary skill in the art, and are not described herein again in detail.

In the description of this specification, description of reference terms such as "specific embodiment" or "specific example", means that features, structures, materials, or features described in this embodiment or example are included in at least one embodiment or example of the present disclosure. In this specification, exemplary descriptions of the foregoing terms do not necessarily refer to the same embodiment or example.

Although the embodiments of the present disclosure have been shown and described, a person of ordinary skill in the art should understand that various changes, modifications, replacements and variations may be made to the embodiments without departing from the principles and spirit of the present disclosure, and the scope of the present disclosure is as defined by the appended claims and their equivalents.

What is claimed is:

1. A vehicle controller, comprising:

a box;

a control board mounted in the box, the control board comprising a communication module, a vehicle control module, a charging control module, and a motor control module, the vehicle control module controlling operations of a vehicle according to signals of the communication module;

a driver board mounted in the box, the control board being connected to the driver board, and the motor control module controlling a motor of the vehicle through the driver board; and an on-off switch mounted in the box and connected to the control board, the on-off switch having an input end and an output end, the charging control module controlling on-off of the input end and the output end, the output end being connected to an energy storage member of the vehicle, and the input end being connected to a charging cable of the energy storage member, wherein a detachable maintenance board is mounted on the box, a first electrical connector is mounted on the detachable maintenance board, a second electrical connector in contact and conductive with the first electrical connector is mounted on the box, and the control board detects on-off of the first electrical connector and the second electrical connector to control on-off of the energy storage member.

2. The vehicle controller according to claim 1, wherein the communication module comprises a signal plug connector, the signal plug connector is exposed from the box and has a plugging area for signal transmission, a signal shielding cover is disposed on the control board, and the signal shielding cover covers a portion of the signal plug connector and exposes the plugging area.

3. The vehicle controller according to claim 1, wherein the input end is connected to a positive charging bar and a negative charging bar, a positive pole of the charging cable is connected to the positive charging bar, a negative pole of the charging cable is connected to the negative charging bar, and the charging cable passes through the box; and the output end is connected to a positive direct current bar and a negative direct current bar, a direct current plug connector is mounted on the box and is exposed from the box, the positive direct current bar and the negative direct current bar are connected to a first end of the direct current plug connector, and a second end of the direct current plug connector is connected to the energy storage member.

4. The vehicle controller according to claim 3, wherein a first magnet ring is mounted on the box, and the positive direct current bar and the negative direct current bar pass through the first magnet ring; and the vehicle controller further comprises:

a capacitor, mounted on the box and having a capacitor input end and a capacitor output end, the direct current plug connector being connected to the capacitor input end; and an insulated-gate bipolar transistor (IGBT) module, mounted on the box and having a direct current input end, an alternating current output end, and a signal output end, the direct current input end being connected to the capacitor output end, the signal output end being connected to the driver board, and the alternating current output end being connected to a three-phase input end of the motor of the vehicle.

5. The vehicle controller according to claim 4, further comprising:

an electromagnetic shielding slab mounted on the box, the control board being located on a first surface of the electromagnetic shielding slab facing away from the box, and the driver board, the capacitor, and the IGBT module are located on a second surface of the electromagnetic shielding slab facing the box.

6. The vehicle controller according to claim 4, further comprising a three-phase adapter bar and a three-phase conductive member mounted on the box, wherein the three-phase conductive member is wrapped with an insulating member, a first end of the three-phase adapter bar is connected to the alternating current output end, a second end of the three-phase adapter bar is connected to a second end of the three-phase conductive member, and a first end of the three-phase conductive member is connected to the three-phase input end of the motor; and a Hall element is disposed on the driver board, and the three-phase adapter bar passes through the Hall element.

7. The vehicle controller according to claim 1, wherein the control board is connected to a resolver plug connector, the resolver plug connector passes through the box and is connected to the motor of the vehicle, and the resolver plug connector is configured to detect an angular displacement and an angular velocity of the motor.

8. The vehicle controller according to claim 1, further comprising:

a direct current plug connector mounted on the box and connected to the energy storage member;

a power board connected to a positive power line, a negative power line, a power signal line, an alternating current adapter end, and a direct current adapter end, the positive power line and the negative power line being connected to the direct current plug connector, and the power signal line being connected to the communication module;

an alternating current output plug connector connected to the alternating current adapter end and mounted on the box, the alternating current output plug connector being exposed from the box; and a direct current output plug connector mounted on the box and connected to a direct current adapter bar and a direct current filter board, the direct current filter board being connected to the direct current adapter end, and the direct current output plug connector being exposed from the box.

9. The vehicle controller according to claim 8, wherein the power board is disposed adjacent to a first surface of the box in a thickness direction of the box, and the control board and the driver board are disposed adjacent to a second surface of the box in the thickness direction of the box opposite to the first surface; and the vehicle controller further comprises:

a first cover plate mounted on the first surface of the box and sealing the power board in the box; and a second cover plate located on the second surface of the box and sealing the control board and the driver board in the box.

10. The vehicle controller according to claim 8, wherein the positive power line is connected to a first electric protection member, and the first electric protection member is connected to the direct current plug connector; and a second magnet ring surrounds a peripheral surface of the direct current adapter bar.

11. The vehicle controller according to claim 8, wherein an alternating current shielding cavity, a power line shielding cavity, a power signal line shielding cavity, and a direct current output shielding cavity are formed on a side surface of the box facing the power board;

a conductor of the alternating current output plug connector is located in the alternating current shielding cavity, an alternating current shielding slab is mounted on the box, and the alternating current shielding slab seals the alternating current shielding cavity;

the positive power line and the negative power line are located in the power line shielding cavity, the power signal line is located in the power signal line shielding cavity, the box comprises a power line cover plate and a signal line cover plate, the power line cover plate seals the power line shielding cavity, and the signal line cover plate seals the power signal line shielding cavity; and the direct current adapter bar and the direct current filter board are located in the direct current output shielding cavity, a direct current shielding slab is mounted on the box, and the direct current shielding slab seals the direct current output shielding cavity.

12. The vehicle controller according to claim 8, wherein the power board comprises:

a board body, the positive power line, the negative power line, the power signal line, the alternating current adapter end, and the direct current adapter end being disposed on the board body;

an alternating current inductor and a direct current inductor respectively mounted on two edge portions of the board body along a width direction of the board body, the alternating current inductor, the direct current inductor, and the power signal line being located at a same end of the board body in a length direction of the board body;

a transformer inductor, mounted on the board body and located between the alternating current inductor and the direct current inductor in the width direction of the board body;

a transformer, mounted on the board body and located at an end of the board body away from the power signal line; and metal oxide semiconductor (MOS) devices, mounted on the board body and located on two end portions of the transformer in the width direction of the board body.

13. The vehicle controller according to claim 12, wherein a direct current inductance shielding cavity, an alternating current inductance shielding cavity, a transformer inductance shielding cavity, and an MOS device shielding cavity are disposed in a side surface of the box facing the power board;

the direct current inductor is located in the direct current inductance shielding cavity, the alternating current inductor is located in the alternating current inductance shielding cavity, the transformer inductor is located in the transformer inductance shielding cavity, and the MOS devices are located in the MOS device shielding cavity; and the board body seals the direct current inductance shielding cavity, the alternating current inductance shielding cavity, the transformer inductance shielding cavity, and the MOS device shielding cavity.

14. The vehicle controller according to claim 1, further comprising:

a direct current plug connector mounted on the box and connected to the energy storage member;

a power supply plug connector mounted on the box and exposed from the box, the power supply plug connector being connected to a positive heating wire and a negative heating wire, the positive heating wire and the negative heating wire being connected to the direct current plug connector, and the power supply plug connector being connected to a heating member for heating the energy storage member;

a third magnet ring is mounted on the box, and the positive heating wire and the negative heating wire passing through the third magnet ring;

the positive heating wire being connected to a second electric protection member, and the second electric protection member being connected to the direct current plug connector; and the power supply plug connector being connected to a compressor of a vehicle air-conditioner.

15. A vehicle, comprising:

a vehicle controller comprising:

a box;

a control board, mounted in the box, the control board comprising a communication module, a vehicle control module, a charging control module, and a motor control module, the vehicle control module controlling operations of the vehicle according to signals of the communication module;

a driver board, mounted in the box, the control board being connected to the driver board, and the motor control module controlling a motor of the vehicle through the driver board; and an on-off switch, mounted in the box and connected to the control board, the on-off switch having an input end and an output end, the charging control module controlling on-off of the input end and the output end, the output end being connected to an energy storage member of the vehicle, and the input end being connected to a charging cable of the energy storage member;

a power box, mounted on the box of the vehicle controller; and the motor and a transmission of the vehicle being in transmission connection and located in the power box, the motor being electrically connected to the driver board, wherein a detachable maintenance board is mounted on the box, a first electrical connector is mounted on the detachable maintenance board, a second electrical connector in contact and conductive with the first electrical connector is mounted on the box, and the control board detects on-off of the first electrical connector and the second electrical connector to control on-off of the energy storage member.

16. The vehicle according to claim 15, wherein the communication module comprises a signal plug connector, the signal plug connector is exposed from the box and has a plugging area for signal transmission, a signal shielding cover is disposed on the control board, and the signal shielding cover covers a portion of the signal plug connector and exposes the plugging area.

17. The vehicle according to claim 15, wherein the input end is connected to a positive charging bar and a negative charging bar, a positive pole of the charging cable is connected to the positive charging bar, a negative pole of the charging cable is connected to the negative charging bar, and the charging cable passes through the box; and the output end is connected to a positive direct current bar and a negative direct current bar, a direct current plug connector is mounted on the box and is exposed from the box, the positive direct current bar and the negative direct current bar are connected to a first end of the direct current plug connector, and a second end of the direct current plug connector is connected to the energy storage member.

18. The vehicle according to claim 17, wherein a first magnet ring is mounted on the box, and the positive direct current bar and the negative direct current bar pass through the first magnet ring; and the vehicle controller further comprises:

a capacitor, mounted on the box and having a capacitor input end and a capacitor output end, the direct current plug connector being connected to the capacitor input end; and an insulated-gate bipolar transistor (IGBT) module, mounted on the box and having a direct current input end, an alternating current output end, and a signal output end, the direct current input end being connected to the capacitor output end, the signal output end being connected to the driver board, and the alternating current output end being connected to a three-phase input end of the motor of the vehicle.

19. The vehicle according to claim 18, wherein the vehicle controller further comprises:

an electromagnetic shielding slab mounted on the box, the control board being located on a first surface of the electromagnetic shielding slab facing away from the box, and the driver board, the capacitor, and the IGBT module are located on a second surface of the electromagnetic shielding slab facing the box.

* * * * *